United States Patent [19]

Snyder

[11] 3,833,860

[45] Sept. 3, 1974

[54] AMPLIFIER SYSTEM HAVING PSEUDO SUMMING JUNCTION

[75] Inventor: John Somerville Snyder, Webster, N.Y.

[73] Assignee: Sybron Corporation, Rochester, N.Y.

[22] Filed: Apr. 20, 1972

[21] Appl. No.: 245,850

[52] U.S. Cl. .................. 330/108, 318/609, 318/641, 318/645, 318/678, 330/1 A

[51] Int. Cl. .................. H03f 1/36

[58] Field of Search ........ 330/1 A, 9, 108; 318/609, 318/677, 678

[56] References Cited

UNITED STATES PATENTS

| | | | |
|---|---|---|---|
| 3,441,863 | 4/1969 | Moriyasu | 330/9 |
| 3,693,067 | 9/1972 | Walsh | 318/609 |
| 3,697,871 | 10/1972 | MacMullan | 318/678 X |
| 5,330,389 | 9/1970 | Gormley et al. | 330/1 A X |

*Primary Examiner*—Herman Karl Saalbach
*Assistant Examiner*—James B. Mullins
*Attorney, Agent, or Firm*—Theodore B. Roessel; Joseph C. MacKenzie

[57] ABSTRACT

A summing amplifier system having a pseudo summing junction in a feedback network for biasing the output of the system by a DC voltage while simultaneously applying a second voltage to a conventional summing junction of the system. As a process variable controller, the system provides proportional control, the said second voltage representing deviation of the process variable, and manual reset, the said DC voltage representing a manual reset voltage.

7 Claims, 2 Drawing Figures

PATENTED SEP 3 1974

3,833,860

AMPLIFIER SYSTEM HAVING PSEUDO SUMMING JUNCTION

FIELD OF THE INVENTION

The present invention is in the field of summing amplifier systems, in particular, such systems as are useful in process control for providing proportional control action and manual reset. In systems of these kinds, it is often desired, on the one hand, to amplify a first input signal by means of an operational amplifier configuration of one sort or another, whereby to produce an output signal which is a function of the first input signal, and, on the other hand, to bias the said output signal by a second input signal.

DESCRIPTION OF THE PRIOR ART

Since the two said input signals are being mixed, in some sense or another, the problem has been to introduce the second input signal without interacting with the amplification of the first input signal, or affecting system input impedance, etc. Prior to my invention, insofar as I am aware, it was not possible to bias the output signal without interaction, or, in order to avoid interaction, without using more than one amplifier in the system in order to obviate input impedance problems, etc.

SUMMARY

In the present invention, a novel summing amplifier system uses a single high gain amplifier, fitted with a conventional sort of feedback circuitry for amplifying a first input signal applied to a conventional summing junction; and a second signal is introduced at a pseudo summing junction of the feedback circuitry. Because of the high gain of the amplifier, the pseudo summing junction behaves like the conventional summing junction, with the result that the amplifier system amplifies the first input signal, as if there were no second input signal applied to it. At the same time, the second input signal biases the output signal insofar as the latter is due to the conventional amplifying action of the system on the first input signal.

The system according to the invention, when provided with a deviation signal source for providing said first input signal, and with a manual reset signal source for providing said second input signal, constitutes a process variable controller providing proportional plus manual reset control action. Accordingly, it is an object of this invention to provide a novel summing amplifier system having a conventional summing junction and a pseudo summing junction. In particular, it is an object of this invention to provide a proportional action plus manual reset process controller including said summing amplifier system arranged to have process variable deviation signal applied to said conventional summing junction, and to have manual reset signal applied to said pseudo summing junction. Another object is to provide said summing amplifier system in the form of an integrator having output bias wherein the signal to be integrated is applied to said conventional summing junction, and said output bias is applied to said pseudo summing junction.

DESCRIPTION OF THE PREFERRED EMBODIMENTS

Figure 1:
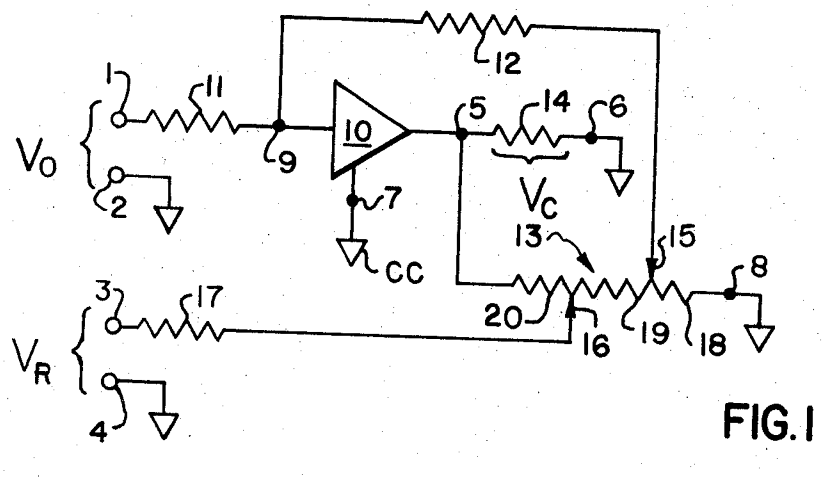
FIG. 1 is a diagram of my novel summing amplifier system.

Referring to FIG. 1, a summing amplifier system according to the invention has input terminals 1 through 4, output terminals 5 and 6, an amplifier circuit common terminal 7, and a feedback circuit common terminal 8. Circuit common is illustrated as an inverted triangle (as exemplified at CC, in the case of terminal 7, so terminals 2, 4 and 6 are also circuit common terminals.)

Reference numeral 9 denotes the input terminal of a high DC gain, inverting operational amplifier 10. By virtue of an input resistance 11, and feedback resistances 12 and 13, input terminal 9 is a summing junction, as it is called, which, due to the inverting property and high gain of the amplifier, is forced to maintain a potential very nearly equal to circuit common potential, despite variations in the voltage $V_D$ across terminals 1 and 2, and variations in the load current drawn by the amplifier's load (e.g., resistance 14, connected across terminals 5 and 6.)

The feedback through resistances 13 and 12 maintains the gain, namely $V_C/V_D$, at a value much less than the gain of the amplifier 10 without feedback. So that the exact value of the net gain may be varied, resistance 13 is provided with a slidable tap 15 to which resistance 12 is connected, and the resistance 13 is connected between terminal 5 and terminal 8. Therefore the gain depends on the setting of the tap 15.

As described thus far, the system is conventional, except for terminals 3 and 4.

However, it is sometimes desired to make the amplifier's output at terminal 5 reflect a voltage $V_r$, across terminals 3 and 4, without the provision for doing so interacting with the conventional function of the system. That is to say, $V_C$'s contribution to $V_C$ is to remain unaffected by injecting $V_R$ into the system.

According to the invention, the aforesaid provision is connecting $V_R$ to what may be called a pseudo summing junction of the system. Thus, as shown, resistance 13 has a second slidable tap 16, connected to terminal 3 by a resistance 17. At the point of electrical contact of tap 16 on resistance 13 is such pseudo summing junction, and, in effect, taps 15 and 16 divide resistance 13 into three separate resistances 18, 19 and 20.

Looked at quantitatively, the amplifier system functions as follows:

$$V_C = -V_D \cdot R_{12}/KR_{11} \cdot (1 + R_{20}/R_P) - V_R \cdot R_{20}/R_{17} \quad (1)$$

In the above equation, $k$ is the usual constant of proportionality, and the $V$'s and $R$'s are volts and ohms, respectively. Also, the numerical subscripts correspond to the reference numerals used in FIG. 1, i.e., $R_{12}$ means the value of resistance 12, and so on. $R_P$ is the product $(R_{18} + R_{19})R_{17}$, divided by $(R_{17}+R_{18}+R_{19})$.

It is evident from inspection of equation (1) that variations in $V_R$ do not affect the contributions of $V_D$ to $V_C$. Further, input impedance of the amplifier is constant and independent of the adjustment of tap 15.

The pseudo summing junction effect perhaps may be best described by saying that it is as if the source of $V_R$ is connected between the input terminal and the output terminal of an amplifier, via $R_{17}$ and $R_{20}$, respectively. In general, the effect is based on the same considerations as the conventional summing junction. Thus, before feedback, amplifier gain must be approximately infinite, there must be approximately zero internal resistance of input voltage sources (actually, when lumped with resistances 11 and 17), and so on. The basic difference is that whereas the source of $V_D$ sees, so to speak, circuit common potential at terminal 9, the source of $V_R$ sees a potential at tap 16 proportional to $V_C$.

In passing, it is to be noted that while the system has been presented from the point of view of biasing $V_C$ with $V_R$, it might just as well be considered a matter of biasing $V_C$ with $V_D$.

Figure 2:
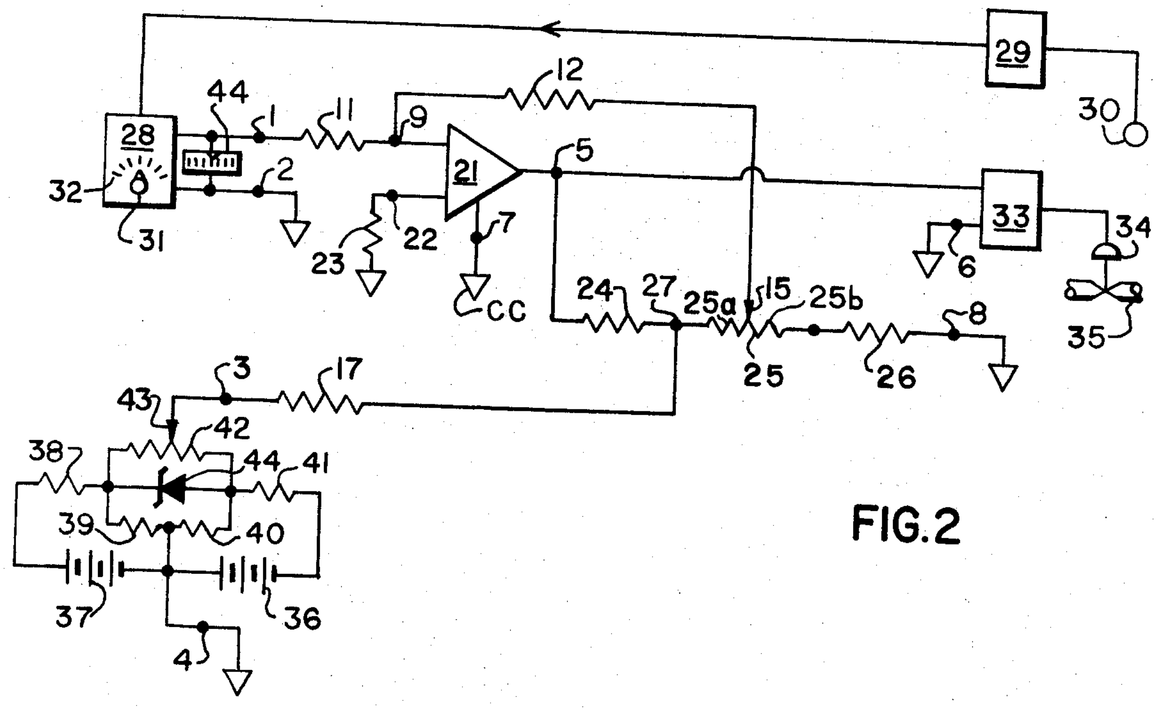
FIG. 2 is a diagram of my novel summing amplifier system in the form of a proportional plus manual reset process variable controller.

FIG. 2 shows a summing amplifier system in the form of a proportional plus manual reset process variable controller. Insofar as applicable, the reference numerals of FIG. 1 have been used in FIG. 2. In fact, it will be observed that the main difference between FIGS. 1 and 2 is in what has been added to what is essentially the circuit shown in FIG. 1.

Insofar as circuitry is concerned, the operational amplifier is shown in FIG. 2 to be a differential amplifier 21, the inverting input terminal of which is terminal 9. The non-inverting terminal 22 of amplifier 21 is connected to circuit common via a resistance 23. Resistance 23 is the usual input current balancing resistance commonly found in differential amplifier configurations.

Further, resistance 13 has been replaced by three discrete resistors 24, 25 and 26. Resistor 25 is a so-called potentiometer the slider of which is tap 15. Resistor 24 exactly corresponds to resistance 20 of FIG. 1. In FIG. 1, the counterpart of tap 16 is the fixed common junction 27 of resistors 17, 24 and 25. Junction 27 is still a pseudo summing junction, of course.

The portion **25*a* of resistor 25, between tap 15 and junction 27 is precisely resistance 19. Finally, the remaining portion 25*b* of resistor 26 plus resistor 26 is precisely resistor 18. In short, resistors 24, 25 and 26 are precisely resistance 13, except that the counterpart of tap 16 has been fixed in position. Circuitwise, therefore, FIG. 2 does not differ from FIG. 1** in any essential.

However, according to FIG. 2, the source of $V_D$ is an instrument 28. Instrument 28 is connected to a process variable transmitter 29 having a process variable sensing element 30 exposed to a process variable such as temperature, pressure or the like. The function of the transmitter is to transmit a measurement signal, quantitatively representing the value of the process variable at any given moment, to instrument 28.

Instrument 28 is essentially a comparing device. Thus, one sets a knob 31 at a place on a scale 32 indicating a value of the process variable it is desired to maintain. The function of the instrument is to produce $V_D$ with a value proportional to the difference between the actual value of the process variable, as measured by transmitter 29, and the desired value thereof, as set by knob 31. In short, $V_D$ is a signal representing deviation of a process variable in a process from a desired value.

In order to control the process, more particularly to reduce the aforesaid deviation to substantially zero, $V_D$ is applied across input terminals 1 and 2, with the result that a control voltage $V_C$ appears across output terminals 5 and 6. In FIG. 2 an instrument 33 is connected across terminals 5 and 6, and it in turn connects to a process control valve 34 in a pipe 35. The function of instrument 33 is to convert the voltage across terminals 5 and 6 into a corresponding degree of opening of valve 34, to the end that mass rate of flow through pipe 35 is controlled so as to influence the aforesaid process variable. Thus, one may suppose that the process has been designed or adjusted so that when the valve is 50 percent open, the process variable will maintain the desired value set by knob 31, under ideal conditions. Therefore, the amplifier 21 or the instrument 33 will be adjusted so that instrument 33 provides, for example, a pneumatic pressure which, applied to valve 34, will hold it 50 percent open when the deviation is zero.

However, for a variety of known reasons, the process variable may deviate from the desired value. If it does, the information is of course transmitted to instrument 28, so $V_R$ changes correspondingly. This change is sensed by the amplifier 21, and its associated circuitry, and converted into a change in $V_C$, so the output of instrument 33 changes accordingly, and opens or closes the valve to a corresponding degree, depending on the sense of the process variable deviation.

The foregoing is typical of what is commonly called proportional control, since the control action is measured solely by the deviation of the actual value of process variable from the value desired therefor. While there are many processes which can, in general, be satisfactorily so controlled, proportional only control has a tendency to produce droop or offset, as is well known, under certain circumstances. For instance, the flow through pipe 35 is, in effect or even literally consumed by the process. If the process demand changes, and the change is large enough and/or not more or less transient, the proportional action may not suffice to control satisfactorily. Thus, in the example referred to above: 50 percent open for the valve, means roughly that the demand of the process on the average is to consume material (heating fluid or fluid, for example) at that rate from the pipe 35. However, if the process demand increases to the point that the valve needs to be 75 percent open for some appreciable length of time, proportional control action tries to more or less simultaneously satisfy the new demand and to reduce the process variable deviation to about zero. Naturally, the result is that the valve settles into a position between 50 and 75 percent, which generally is unsatisfactory.

The above sort of problem has been solved in various ways in the past. One approach is so-called manual reset. That is to say, a human operator in some way or another intervenes to get the valve to the correct position to satisfy the demand. According to the present invention, the human operator does this by controlling $V_R$, the manual reset voltage.

While the source of this voltage may take many forms, FIG. 2 shows one suitable form to be batteries 36 and 37, resistors 38 through 42, and zener diode 44. Resistor 43 is in the form of a potentiometer 42, the slidable tap of which is connected to input terminal 3. The positive pole of battery 36 and the negative pole of battery 37 are connected together and to circuit common via input terminal 14. Supposing the battery voltages to be equal, resistors 39 and 40 to be equal, and resistors 38 and 41 to be equal, then at the mid-point of resistor 42, $V_R$ is zero, but as the tap 43 is moved to the left or the right $V_R$ increases in the positive sense, or increases in the negative sense, respectively.

Referring back to equation (1), it will be observed that tap 15 can be set to establish the proportional action gain of the system. From experience with the process, etc., one will know when the process is behaving in a way that is amenable to being controlled solely by proportional action. For this control regime, $V_R$ may be set to zero, or even may be used to initially set the valve position for the expected demand.

In any event, whenever the process gets into a condition wherein proportional action alone cannot reduce the deviation of the process variable to zero, $V_R$ can be varied to help out the proportional action. Thus, if the proportional action is intended to handle deviations with respect to a 50 percent valve open demand, and the demand changes to 75 percent valve open, then tap 43 can be moved to the left, thereby increasing the magnitude of the right-hand side of equation (1), (supposing, of course, that valve 34 increases its opening, when VC goes more negative) to increase the valve opening to 75 percent. Actually, in the usual case, the amount of manual reset will be gauged by watching a deviation indicator 44, designed to indicate the value and sense of deviation of $V_R$ from a value corresponding to the desired value of the process variable. Ordinarily, the human operator will have no means of telling precisely when the new demand is being satisfied, except by observing the effect of trial and error in setting tap 43.

As for droop, this is in effect a special form of offset, which is sometimes desired in controlling certain systems, so may be applied by means of manual reset therein, in appropriate circumstances. Obviously, the controller according to my invention can be used to manually create or modify offset, as well as remove it.

In one particular example of a proportional plus manual reset controller according to the invention, parts values were as follows:

| | K ohm |
|---|---|
| $R_{11}$ | 499 |
| $R_{12}$ | 280 |
| $R_{23}$ | 180 |
| $R_{24}$ | 20 |
| $R_{25}$ | 10 |
| $R_{26}$ | 100 |
| $R_{17}$ | 4.42 |

Amplifier 21 was actually a conventional, off the shelf operational amplifier, with an FET differential input stage added for buffering. The total amplifier had a before-feedback gain on the order of 20,000, and, due to the FET input stage, sufficiently high input impedance that terminal 22 could have been connected directly to circuit common, instead of through resistor 23.

The foregoing parts list is purely illustrative. Moreover, the purely resistive nature of the illustrated circuitry is subject to obvious modifications. For instance, in FIG. 1, if $R_{12}$ is replaced with a capacitor, the basic circuit becomes an integrator of well known type, except that according to the invention, the pseudo summing junction provides for adding to the integrator output, a non-interacting DC bias in the form of $V_R$. The time constant of such integrator would be adjustable by means of tap 15.

In another variation of the invention, in FIG. 2 tap 15 could be directly connected to junction 27, which would have the effects of transforming resistor 25 into a simple variable resistor and of connecting resistor 12 directly to junction 27. The operation of the circuit would nevertheless be substantially unchanged.

As will be evident from Equation (1), the foregoing variations far from exhaust the possibilities for modifying the system. For example, resistances 11, 12 and 13 only appear in the $V_D$ term of equation (1). Therefore, any one or more of them may be replaced by capacitors and/or inductors, without sacrificing the non-interaction between $V_D$ and $V_R$, and also without sacrificing non-interaction of adjustment of values of such components.

Further, replacement or adjustment of resistances appearing in both the $V_D$ and $V_R$ terms of the equation, will not sacrifice non-interaction between $V_D$ and $V_R$, because the pseudo summing junction property remains, even though replacement or adjustment affects circuit parameters common to the $V_D$ and $V_R$ terms.

Having described my invention in accordance with the requirements of 35 USC 112, I claim:

1. A controller comprising, in combination, a high gain inverting amplifier having a first resistance connected at one end to the input of said amplifier and having a second resistance connected at one end to the output of said amplifier for receiving output therefrom, said second resistance having its other end connected to circuit common for said amplifier; there being a third resistance connected at one end to a first point on said second resistance for applying voltage to said second resistance at said first point; and there being a feedback resistance connected between said input and a second point on said second resistance for feedback of voltage at said second point to said input, said first point being at least as far away electrically from said circuit common as is said second point.

2. The controller of claim 1, wherein a variable voltage source is connected to the other end of said third resistance.

3. The controller of claim 2, wherein a source of process deviation voltage is connected to the other end of said first resistance.

4. The controller of claim 1 wherein said second resistance includes a variable portion between said points.

5. The controller of claim 1 wherein said second resistance includes a variable portion between said second point and said circuit common.

6. The controller of claim 1, wherein said second resistance includes a variable portion between said points, and a variable portion between said second point and said circuit common.

7. The controller of claim 1 wherein said second resistance includes a resistor between said first point and said circuit common, said resistor having a slider movable along said resistor and connected to said feedback resistance for providing said second point.

* * * * *